(12) United States Patent
Blanton et al.

(10) Patent No.: US 7,097,902 B2
(45) Date of Patent: Aug. 29, 2006

(54) SELF ASSEMBLED ORGANIC NANOCRYSTAL SUPERLATTICES

(75) Inventors: Thomas N. Blanton, Rochester, NY (US); Ramesh Jagannathan, Rochester, NY (US); Seshadri Jagannathan, Pittsford, NY (US); Rajesh V. Mehta, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 91 days.

(21) Appl. No.: 10/744,539

(22) Filed: Dec. 22, 2003

(65) Prior Publication Data

US 2005/0136250 A1    Jun. 23, 2005

(51) Int. Cl.
*B32B 5/16* (2006.01)
(52) U.S. Cl. ............ 428/330; 428/323; 428/332; 428/334; 428/336; 428/338; 427/180
(58) Field of Classification Search ............ None
See application file for complete search history.

(56) References Cited

U.S. PATENT DOCUMENTS

2003/0030706 A1    2/2003    Jagannathan et al.
2003/0054957 A1*   3/2003    Irvin et al. ............ 502/416
2003/0121447 A1    7/2003    Irvin et al.
2003/0122106 A1    7/2003    Irvin et al.

OTHER PUBLICATIONS

Zhao-hui Chen, Ying Ma, Jian-nian Yao; "Self-Assembled Inorganic/Organic Composite Superlattice Thin Films With Photochromic Properties"; Thin Solid Films; vol. 384; 2001; pp. 160-165.

C. B. Murray, C. R. Kagan, M. G. Bawendi; "Synthesis And Characterization Of Monodispersed Nanocrystals And Close-Packed Nanocrystal Assemblies"; Annual Review Of Materials Science; vol. 30' 2000; pp. 545-610.

* cited by examiner

*Primary Examiner*—Monique R. Jackson
(74) *Attorney, Agent, or Firm*—Andrew J. Anderson

(57) ABSTRACT

A process for the preparation of a self assembled superlattice thin film of organic nanocrystal particles is described comprising: (i) combining one or more functional organic material to be precipitated as nanocrystal particles and one or more surface active material in a compressed $CO_2$ phase with a density of at least 0.1 g/cc, where the functional material is substantially insoluble in the compressed $CO_2$ in the absence of the surfactant, the surfactant comprises a compressed $CO_2$-philic portion and a functional material-philic portion, and the compressed $CO_2$ phase, functional material and surfactant interact to form an aggregated system having a continuous compressed $CO_2$ phase and a plurality of aggregates comprising surfactant and functional material molecules of average diameter less than 50 nanometers dispersed therein; (ii) rapidly depressurizing the compressed $CO_2$ phase thereby precipitating the dispersed functional and surfactant materials in the form of composite organic nanocrystals of average diameter less than 50 nanometers, and (iii) depositing the organic nanocrystals on a substrate surface, wherein the organic nanocrystals form a thin film having an ionic content of less than 0.001 M in equivalent sodium chloride concentration on the substrate surface, and the thin film exhibits a long range periodicity in the arrangement of the organic nanocrystals in a self assembled superlattice structure, as evidenced by x-ray diffraction.

20 Claims, 8 Drawing Sheets

SELF ASSEMBLED ORGANIC NANOCRYSTAL SUPERLATTICES

FIELD OF THE INVENTION

This invention describes self-assembled organic nanocrystal superlattices, which represent a new class of materials and a method to prepare them.

BACKGROUND OF THE INVENTION

Interactions between atoms in condensed matter result in properties that are characteristic of bulk solids. Bulk solids are classified as large particles or crystallites that are multiple tens of nanometers or larger in size. Classic scientific fields of study including physics, chemistry, and materials science that are used to explain the physical, mechanical, optical, etc., properties of bulk solids require the use of quantum mechanics to explain observed phenomena such as chemical bonds, superconductivity, electron spin and magnetic properties of matter, radiant heat emission, or radioactive decay.

As the length scale in these bulk solids approach a very small size, e.g., <50 nm (where nm=nanometer, i.e., $10^{-9}$ meter), these materials exhibit changes in properties that diverge from those in the bulk state. Particles in this size range can be referred to as nanocrystals. These changes in properties are the result of a reduction in electron energy levels. For example, small nanocrystals of gallium nitride (GaN), referred to as quantum dots, have been shown to have a photoluminescence peak centered at 2.95 eV (electron volts), which is 0.5 eV below the bulk GaN bandgap (B. Daudin et al., MRS Internet J. Nitride Semicond. Res. 4S1, G9.2 (1999)). These quantum dots trap electrons in a point comprised of a tiny cluster of inorganic semiconductor material <30 nm in diameter. Many investigators believe that quantum dots will provide a variety of advances for electronics: increased efficiency, reduced power consumption, increased speed of operation and novel electronic characteristics (M. May, Science Observer, July-August (1996)). A challenge that exists is to develop general processes for creating these small nanocrystals at the required size scale.

When these small nanocrystals are organized in a manner such that interparticle separations are on the order of 0.5–10 nm, energy transfer between neighboring nanocrystals and electronic tunneling between proximal nanocrystals gives rise to dark and photoconductivity (C. B. Murray et al., Annu. Rev. Mater. Sci., 30, 545–610 (2000)). At separations <0.5 nm exchange interactions result in semiconducting, metallic, or superconducting properties in assemblies that are normally insulating in the bulk. A major challenge in this area is to develop a general procedure for creating superlattices of nanocrystals (an ordered, periodic array of nanocrystals) having the desired interparticle separation necessary to produce desired materials properties.

Most of the nanocrystal work mentioned in the literature centers around inorganic/ionic materials (C. B. Murray et al., IBM J. Res. & Dev., v45, No. 1, pp 47–56, January 2001). The assembly of atoms to generate superlattices of such inorganic nanocrystals requires specific methods of synthesis and functionalities added to surfaces to induce self-assembly. Generation of self-assembled superlattices of inorganic nanocrystals has been reviewed in the literature (C. B. Murray, et al., Ann. Rev. Mat. Sci., 30, 545–610 (2000). Typically, fabrication of self-assembled nanocrystals starts with atomic deposition onto a surface of a semiconducting substrate, with the deposited material having a smaller bandgap than the substrate (P. Petroff, Physics Today, 54(5), 46–54 (2001)). Though this and other similar methods, which are high vacuum processes, such as molecular beam epitaxy (MBE) or chemical-vapor deposition (CVD) are currently practiced, they require exacting control of deposition parameters. Typically, the procedures described for creating self-assembled superlattices of inorganic nanocrystals require very slow solvent evaporation under controlled conditions, as rapid evaporation of the solvent will result in an amorphous aggregate.

Organic compounds are defined as molecular compounds containing the element carbon with covalent bonds. Such compounds are most often isolated or synthesized from petroleum, coal, vegetable, or animal sources, as well as synthesized from other organic, carbonate, or cyanide compounds (R. T. Morrison and R. N. Boyd, *Organic Chemistry* $3^{rd}$ edition, Allyn and Bacon Inc., Boston, 1, (1976)). Though the number of classes of organic molecular materials is significantly greater than inorganic compounds, the literature related to formation of organic molecular nanocrystals is limited. One example of the formation of organic molecular nanocrystals previously described relates to dye compounds that form H- or J-aggregates. The number of monomer units associated with H- and J-aggregate nanocrystals has been estimated to be ca. 4 monomer units per absorbing unit (A. Herz, Photog. Sci. Eng., 18, 323–335 (1974)). Interactions among dye molecules can generate large spectral shifts and/or changes in spectral band shape and intensity in absorption spectra. The magnitude and the direction of these shifts are determined by the internal structure (i.e., H- or J-aggregate structure) of the nanocrystal. It is known that nanocrystals of certain dyes can be generated by gradually increasing their concentration in solution, and the internal structure of the nanocrystal is identified by the gradual shift of the absorption spectra to shorter wavelength (in the case of H-aggregates) or a sudden shift to longer wavelengths (as in the case of J-aggregates) (E. Jelley, Nature, 138, 1009–1010 (1936)). These H- and J-aggregate nanocrystals exhibit unique properties that differ from the properties of the bulk solid, and are used, e.g., in silver halide based photographic products.

Precipitation from liquid solvents is regarded as a general process for generating crystals of organic molecular materials. An analogous, general process for generating nanocrystals of organic materials is precipitation from compressed fluids such as $CO_2$ by the rapid expansion of supercritical solutions (RESS) techniques such as described in U.S. 2003/0054957 A1. Nanoscale particles resulting from such process may exhibit multiple molecular packing structures that are the result of rapid depressurization leading to rapid desaturation of a compressed fluid that contains an organic molecular material. A fundamental difference between precipitation from liquids and precipitation from compressed fluids such as $CO_2$ by the RESS process is the significantly faster rates of supersaturation generation and dissipation (D. Matson et al., Ind. Eng. Chem. Res., 26, 2298–2306 (1987)). Hence, precipitation from compressed fluids such as $CO_2$ is a convenient process for generating organic nanocrystals.

An important challenge in the study of organic nanocrystals is the ability to create self assembled organic nanocrystal superlattices. High vacuum techniques used for creating superlattices of inorganic nanocrystals are not easily adapted to deposition of most organic or polymer materials (S. Forrest, MRS Bulletin, Jan.Feb., 108–112, (2001)). Further, deposition on large substrates using high vacuum techniques is difficult due to practical limitations of chamber size as well as problems with proper substrate alignment and deposition pixellation. Techniques such as spin casting or spraying from liquids, which are sometimes used to create superlattices of inorganic nanocrystals, are limited by the solvent evaporation process. After coating, the solvent must be removed, which hinders the ability to make defect-free coatings. Spin-casting techniques are also limited in terms of scalability, due to a limit in the substrate size that can be accommodated in a spin-cast apparatus.

Langmuir-Blodgett (LB) film techniques have been shown to be of use for deposition of organic and polymer materials, especially for the deposition of molecularly self assembled materials. However, it is not clear that such LB techniques would be useful in generating self assembled superlattices of organic nanocrystals (the distinction being that organic nanocrystals comprise a cluster of organic molecules, and hence the superlattice is a self assembled structure where each individual entity is a cluster of molecules). Further, scaling LB methods for large-scale applications is prohibitive due to technical considerations including the need for clean-room environment and functionalized surfaces which are material specific. Cost considerations are also an issue in trying to scale up LB deposition. A LB deposition apparatus built at the University of Connecticut (C. Mirley et al., Langmuir, 10, 230–2375 (1994)), e.g., was capable of dipping the substrate to be coated at a rate up to 0.13 m (meters) per minute, and the device had to be housed in a class 100 clean room. At the United States Department of Energy Pacific Northwest National Laboratory, a state of the art KSV-5000 Langmuir-Blodgett Instrument has been configured in a class 1000 clean room which is capable of dip coating a substrate at a rate up to 0.80 m per minute. The maximum substrate size that can be coated is 0.1 m×0.1 m.

In contrast, in conventional roll-roll coating operations (e.g., offset printing), flexible substrates are coated at speeds that are faster than the state of the art LB techniques by more than three orders of magnitude. Further, the width and the length of the substrate coated in these roll-to-roll operations are also typically significantly larger (e.g., width by at least an order of magnitude and the length by 4–5 orders of magnitude).

Hence, there is a need for a process that would allow for the rapid generation of organic molecular nanocrystal superlattices. In particular, there exists a need for a simple, robust and rapid coating procedure for the generation of self assembled, superlattice thin films of organic molecular nanocrystals, that can be easily adapted and scaled to a large number of materials, surfaces, environments and deposition conditions. Such a procedure can find application in many technologies and industrial products requiring thin films of organic materials such as display technologies and display products that can include liquid crystal (LC) displays and organic light emitting diode (OLED) displays.

In the case of charged colloidal suspensions, it has been observed that crystallization may be induced by deionizing the suspension to an ionic strength below about 0.001 M (Y. Monovoukas and A. P. Gast, J. Colloid Interface Sci., 128, 533–548, (1989). The general procedure used here is again very slow, requiring the use of ion exchange resin to reduce the ionic strength of the suspension. Hence, once again, there is a need for process that would allow for the rapid generation of organic nanocrystal superlattices.

SUMMARY OF THE INVENTION

In accordance with one embodiment of the invention, a process for the preparation of a self assembled superlattice thin film of organic nanocrystal particles is described comprising: (i) combining one or more functional organic material to be precipitated as nanocrystal particles and one or more surface active material in a compressed $CO_2$ phase with a density of at least 0.1 g/cc, where the functional material is substantially insoluble in the compressed $CO_2$ in the absence of the surfactant, the surfactant comprises a compressed $CO_2$-philic portion and a functional material-philic portion, and the compressed $CO_2$ phase, functional material and surfactant interact to form an aggregated system having a continuous compressed $CO_2$ phase and a plurality of aggregates comprising surfactant and functional material molecules of average diameter less than 50 nanometers dispersed therein; (ii) rapidly depressurizing the compressed $CO_2$ phase thereby precipitating the dispersed functional and surfactant materials in the form of composite organic nanocrystals of average diameter less than 50 nanometers, and (iii) depositing the organic nanocrystals on a substrate surface, wherein the organic nanocrystals form a thin film having an ionic content of less than 0.001 M in equivalent sodium chloride concentration on the substrate surface, and the thin film exhibits a long range periodicity in the arrangement of the organic nanocrystals in a self assembled superlattice structure, as evidenced by x-ray diffraction.

BRIEF DESCRIPTION OF THE DRAWINGS

In the detailed description of the preferred embodiments of the invention presented below, reference is made to the accompanying drawings.

DETAILED DESCRIPTION OF THE INVENTION

Figure 1:
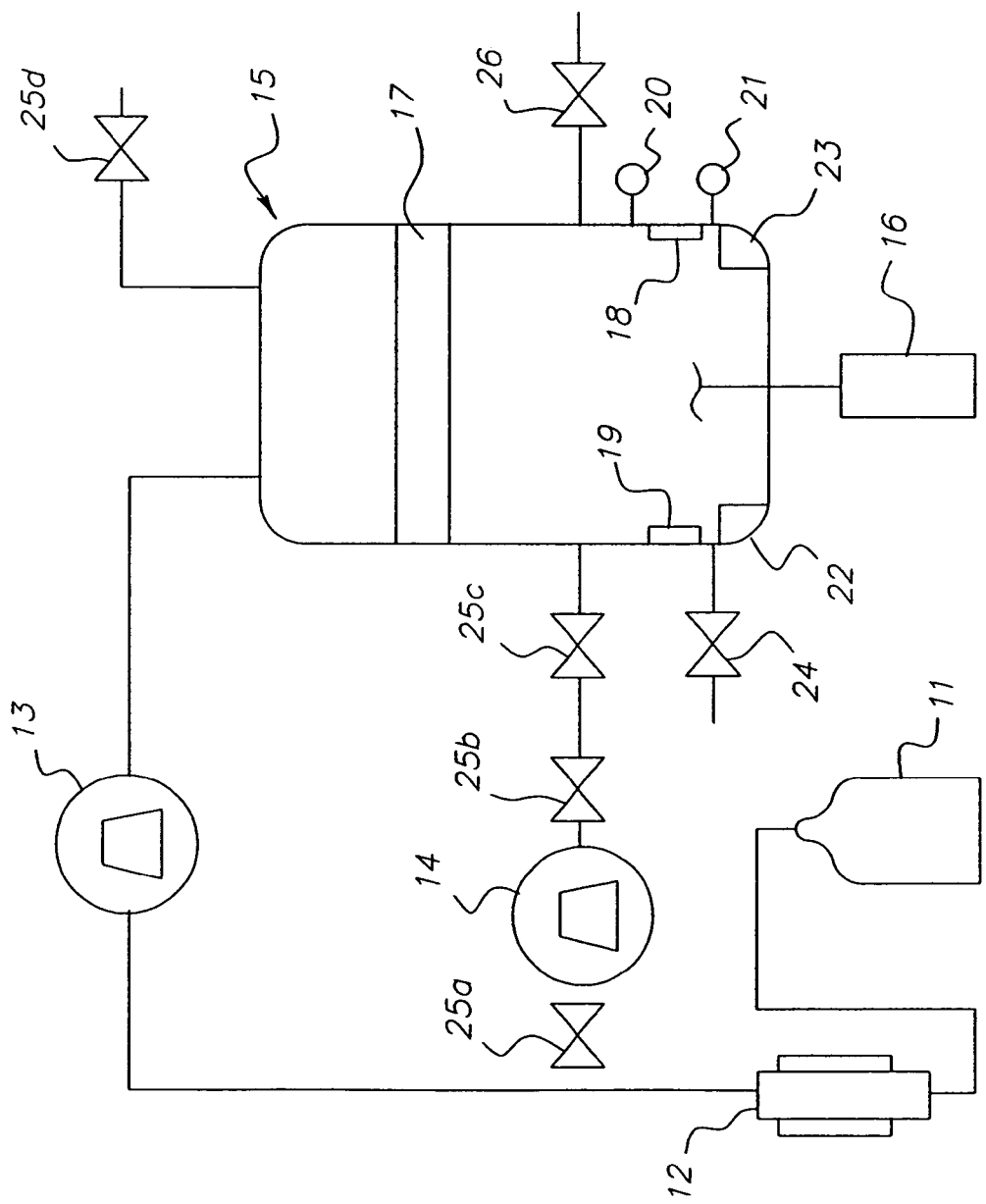
FIG. 1: Schematic of the experimental apparatus.

The present invention enables the creation of self assembled organic molecular nanocrystal superlattices to be formed by the non-reactive processing of one or more functional organic materials that are solids and/or liquids at ambient temperature and pressure, in conjunction with one or more surfactant/dispersant material, within a carrier fluid that comprises carbon dioxide that is in the compressed gas, liquid and/or supercritical fluid phase with a density $\geq 0.1$ g/cc. The one or more functional organic materials are dispersed in the carrier fluid (which may be a mixture of one or more supercritical fluids/compressed liquids and/or co-solvents) in the form of micelle aggregates formed with one or more suitable dispersants/surfactants to create a precursor formulation. Controlled depressurization of this precursor formulation results in the evaporation of the carrier fluid and the formation of the organic nanocrystals, which upon deposition on a desired substrate form superlattices on the substrate surface. Organic nanocrystal superlattices produced in accordance with the invention may include functional materials useful, e.g., in imaging applications, including photographic and printing applications, and in particular inkjet printing applications, in electronic display device applications, including color filter arrays and organic light emitting diode display devices, in coating applications, in polymer filler applications, in data recording, in wear resistant and/or lubrication/tribological coatings, in microstructure/nanostructure architecture building, in antistatic coatings, in optical coatings, in lithographic mask, and in heat-transfer.

The precursor formulations formed in the process of the present invention contain a functional organic material and a surfactant, aggregates of which are dispersed in a compressed carbon dioxide fluid having a density greater than 0.1 grams/cc. The compressed carbon dioxide fluid may be in the form of a compressed gas, a compressed liquid and/or a supercritical fluid, which is maintained at a temperature and a pressure suitable for the formation of a dispersion of aggregates of the functional material and the surfactant in the compressed fluid. Preferably, the formulation conditions are temperatures in the range of from 0 to 100° C. and pressure in the range from greater than 1 to about 400 atm, more preferably temperatures from 10 to 60° C. and pressure from 40 to about 400 atm.

Carbon dioxide has unique physical properties and in general to date, only a small class of materials are known which have appreciable solubility in $CO_2$. These materials that have appreciable solubility are termed $CO_2$-philic. Materials that are substantially insoluble in $CO_2$ are termed $CO_2$-phobic. In accordance with the invention, functional materials which are substantially insoluble in compressed $CO_2$ are dispersed in a continuous compressed $CO_2$ phase with the aid of surfactants having a $CO_2$-philic portion and a $CO_2$-phobic portion having affinity to the functional material. The surfactant included in the precursor formulation is selected to interact with the functional material and the compressed carbon dioxide to form an aggregated system (e.g., which can comprise micellar assemblies or microemulsions) comprising a $CO_2$ continuous phase having a plurality of aggregates of average diameter less than 50 nanometers dispersed therein which comprise surfactant and functional material molecules.

Surfactants are amphiphilic entities that contain a component that is soluble in the bulk phase and a component that is not soluble in the bulk phase. Traditional surfactants used for solubilization in aqueous (or nonaqueous, for that matter) media are classified as comprising hydrophilic and hydrophobic components. The hydrophilic part is the water-soluble component and the hydrophobic part is the water insoluble component. Drawing from this terminology, surfactants to be used for forming dispersions of aggregates of $CO_2$-phobic materials in compressed $CO_2$ in the process of the invention are defined as comprising a $CO_2$-philic part that is soluble in the compressed $CO_2$ phase and a $CO_2$-phobic, functional material-philic part that is insoluble in the compressed $CO_2$ phase and which has an affinity towards the functional material. In general hydrophilic components are $CO_2$-phobic but hydrophobic components may or may not be $CO_2$-philic; i.e., criteria for choice (identification) of specific surfactants to be used for solubilization of materials in compressed $CO_2$ cannot be made based solely on the knowledge of surfactants used in traditional liquid (aqueous or non-aqueous) phase systems.

Representative surfactants containing $CO_2$-philic and $CO_2$-phobic portions which may be used in accordance with the invention include those described, e.g., in U.S. Pat. Nos. 5,789,505, 5,944,996, 6,131,421, and 6,228,826, the disclosures of which are incorporated by reference herein. The significance of the $CO_2$-philic portion of surfactants used in accordance with the invention is to introduce the surfactant into the $CO_2$ bulk phase. Fluorocarbons and siloxanes have been identified as two preferred classes of materials which may generally function as $CO_2$-philic components in surfactants (see, e.g., *Supercritical Fluid Cleaning*, J. McHardy and S. Sawan, Eds., Noyes Publications, Westwood, N.J. (1998), pp. 87–120, Chapter 5, as well as U.S. Pat. Nos. 5,944,996, 6,131,421, and 6,228,826 referenced above). Another moiety that has been discovered recently is a polyether carbonate surfactant (Sarbu, T., Styranec, T., Beckman, E. J., "Non-Fluorous Polymers with Very High Solubility in Supercritical $CO_2$ down to Low Pressures," Nature (2000), 405, 165). Acetylenic alcohols and diols exhibiting surface active properties in $CO_2$ are described in U.S. Pat. No. 5,789,505.

Examples of $CO_2$-phobic groups include molecular units containing various functional groups such as amides, esters, sulfones, sulfonamides, imides, thiols, alcohols, dienes, diols, acids (such as carboxylic, sulfonic, phosphoric), salts of acids, ethers, ketones, cyanos, amines, quaternary ammonium salts, and thiazoles, as well as lipophilic, oleophilic, and aromatic polymers or oligomers formed from monomers such as ethylene, alpha-olefins, styrenics, acrylates, ethylene and propylene oxides, isobutylene, vinyl alcohols, acrylic acid, methacrylic acid, and vinyl pyrrolidone. The significance of the $CO_2$-phobic portion of surfactants used in accordance with the invention is that the proper selection of this segment to have affinity to the functional material will enable the formation of aggregates comprised of the $CO_2$ insoluble functional material of interest (whether hydrophilic or hydrophobic) and the surfactant dispersed in the compressed $CO_2$ phase. For dispersing functional materials containing ionic or other hydrophilic groups, the $CO_2$-phobic, functional material-philic portion of the surfactant may advantageously be selected from among known hydrophilic groups, and in particular ionic functional groups.

Examples of commercially available fluorocarbon based surfactants (often perfluoropolyether), which may be useful in the process of the invention, include Fomblin™ (Ausimont Montedison Group), Fluorolink™ (Ausimont) and Krytox™ (Dupont) families of surfactants. Particularly preferred surfactants for use in the invention include Fluorolink 7004™ (Ausimont Montedison Group) and Fomblin MF-300™ (Ausimont). Descriptions and examples of siloxane-based surfactants (often polydimethylsiloxane), which may be used in accordance with the invention, include the end-functionalized polysiloxane surfactants described in U.S. Pat. No. 6,228,826.

The selection of a surfactant having a $CO_2$-phobic segment, which has affinity for the functional material to be precipitated, is crucial to the process of the invention. If a surfactant is chosen which does not have a segment, which interacts with the functional material, the functional material will not be able to be dispersed in aggregates formed with the surfactant. For example, the surfactant Fluorolink 7004™ has a segment that is highly fluorinated and the other segment is carboxylic acid based (hydrophilic). The nature of the carboxylic acid segment allows for affinity to functional materials such as via either electrostatic charges, hydrogen bonding, or Van der Waals interactions. The affinity to the functional material is further tunable by varying the identify of cation salts; e.g., $H^+$ may be substituted with $Na^+$ or $NH_4^+$, etc.

The functional materials may be selected from organic species, which are substantially insoluble in the compressed carbon dioxide in the absence of surfactant. Substantial insolubility is intended to mean solubility of less than 0.1 wt %, more preferably less than 0.05 wt %, in compressed carbon dioxide at the temperature and pressure of the precursor formulation. Such organic materials may be of the types such as pure organic or metallo-organic, and may be in the form of monomeric, polymeric, or oligomeric structures, including synthetic and/or natural polymer materials, and a composite material of these previously mentioned. Functional materials can be, for example dyes or pigments, agricultural chemicals, commercial chemicals, fine chemicals, food items, nutrients, pesticides, photographic chemicals, explosive, cosmetics, protective agents, or other industrial substances whose desired form is that of a superlattice thin film. Dyes and pigments are particularly preferred functional materials, as described, e.g., in U.S. Pat. No. 6,595,630, U.S. 2003/0121447, and U.S. 2003/0122106, the disclosures of which are hereby incorporated by reference.

The wt. ratio of compressed $CO_2$ fluid to functional material in the precursor formulation will typically be from about 100,000:1 to about 1:1, more preferably from about 5,000:1 to about 50:1, so that after suitable mixing with the surfactant and the compressed fluid the functional material is uniformly dispersed in a thermodynamically stable/metastable mixture with the compressed fluid. The ratio of surfactant to functional material is selected so as to be sufficient to enable the self-assembly of aggregates of such materials of less than 50 nm size in the compressed $CO_2$, preferably less than 10 nm. In general, such aggregates will typically contain less than about 500 molecules of the functional compound, more typically less than about 100 molecules, and preferably less than 50 molecules, more preferably less than 25 molecules, or even less than 10 molecules of the functional compound, in association with the surfactant. The precise ratio of the surfactant:functional material necessary for forming aggregates of such size will depend upon the specific class of materials, but in general a molecular ratio of at least 0.05:1 will typically be required, with ratios of at least 1:1 preferred and ratios of at least 10:1, 30:1, 60:1 and even 100:1 being more preferred to facilitate formation of dispersed aggregates of less than 10 nm size. While higher levels may be used, molecular ratios of less than 500:1, and more preferably less than 200:1, are preferred.

A method of preparing the precursor formulation will now be discussed. Apparatus which may be used for making the formulation has been disclosed in U.S. Pat. No. 6,471,327, the disclosure of which is incorporated by reference herein. Additional suitable apparatus is described in U.S. Pat. Nos. 4,582,731, 4,734,227, 4,582,731, 4,734,451, 5,301,664, 5,639,441, 6,177,103, 6,299,906, and 6,316,030, the disclosures of which are incorporated by reference herein. Briefly, the functional organic material and surfactant are controllably introduced into a formulation reservoir, preferably in the form of powders. The compressed $CO_2$ fluid is also controllably introduced into the formulation reservoir. The contents of the formulation reservoir are preferably suitably mixed using mixing device to ensure intimate contact between the functional material, surfactant and compressed fluid. As the mixing process proceeds, functional material becomes associated with the surfactant in the form of aggregates and becomes dispersed within the compressed fluid. The process of aggregate formation/dispersion, including the amount of functional material and the rate at which the mixing proceeds, depends upon the functional material itself, the initial particle size and particle size distribution of the functional material (if the functional material is supplied as a solid), the surfactant, the temperature, and the pressure within the formulation reservoir. When the mixing process is complete, the mixture or formulation of functional material, surfactant and compressed fluid is preferably a thermodynamically stable/metastable compositions where the functional material is dispersed within the compressed fluid in such a fashion as to be indefinitely contained in the same state as long as the temperature and pressure within the formulation chamber are maintained constant. This state is distinguished from other physical mixtures in that there is no settling, precipitation, and/or agglomeration of functional material particles within the formulation chamber unless the thermodynamic conditions of temperature and pressure within the reservoir are changed. As such, the aggregated dispersion of functional material, surfactant and compressed fluid mixture or precursor formulation is said to be thermodynamically stable/metastable.

The method for rapidly depressurizing the compressed $CO_2$ phase and thereby precipitating the dispersed functional and surfactant materials in the form of organic nanocrystals will now be discussed. During the depressurization of the formulation vessel, the components of the vessel are expanded through a suitable orifice into an atmosphere, preferably ambient, where the $CO_2$ will become a gas. The dispersed aggregates of functional material and surfactant will begin to precipitate non-reactively into organic nanocrystals. Advantageously, the presence of the surfactant limits subsequent growth of nanocrystals, thereby enabling the formation of nanocrystals of less than 50 nm size, more preferably less than 10 nm. The size of the precipitated organic nanocrystals can be controlled by the appropriate selection of the surfactant material such as the type of functional groups on the molecule as well as the solubility in the compressed $CO_2$ fluid. The size of the precipitated organic nanocrystals can also be controlled by the ratio of functional material to surfactant, as well as through suitable orifice design and optimization of temperature of solution, pressure of solution, flow rate of solution, and concentrations of the functional materials and surfactants.

Organic nanocrystals can be individual particles or a cluster of particles. The preferred size of organic nanocrystal particles is less than 50 nanometers, more preferred less than 30 nanometers, and most preferred less than 20 nanometers. The molecular weight of an organic nanocrystal has a lower limit of about 10 and a preferred upper limit of 100,000, a more preferred upper limit of 20,000, and a most preferred upper limit of 10,000. Organic nanocrystal materials are by definition a result of the precipitation methods described in this invention, and do not require any further processing steps, such as milling or grinding, to be of acceptable size for end use.

In accordance with the invention, the precipitated organic nanocrystals are coated on a suitable substrate, upon which the nanocrystals arrange themselves in a periodic, orderly fashion over a long range, forming a superlattice thin film, typically of thickness less than about 10 micrometers, preferably less than 1 micrometer, and more preferably less than 0.1 micrometer. The length range over which the superlattice periodic order is observed is usually expressed as a multiple of the size of the organic nanocrystals. The repeating, periodic spacing between the organic nanocrystals is usually referred to as the "d-spacing" of the superlattice. The "d-spacing" is usually determined through well-known X-ray powder diffraction method, usually carried out at "small angles" of incidence. The "small angles" of incidence are usually observed in a range of between 1 degree to 10 degrees 2-Theta diffraction angles. The phenomenon of the periodic array formation of organic nanocrystals into a superlattice thin film structure is referred to as a "self-assembly". The d-spacing of the self-assembled structure can, in general, range from 0.5 nm to 100 nm, preferably in the range of 0.5 nm to 10 nm.

Surprisingly, it has been found that a wide variety of organic materials may be desposited in the form of self-assembled superlattice thin films employing the compressed fluid organic nanocrystals formation process in accordance with the invention, as long as the thin film created upon deposition on the receiving medium (liquid, bulk solid, surface of solid) have an ionic content less than ca. 0.001 M, as higher ionic contents inhibit the formation of self-assemble superlattice structures. Hence, it is imperative that the ionic content of the receiving medium that can dissolve in the thin film thus created is sufficiently low such that the organic nanocrystal thin film created on the substrate has an ionic strength lower than 0.001 M (for purposes of the invention measured in equivalent sodium chloride concentration).

The precipitated organic nanocrystals to be deposited for formation of the superlattice structure can be collected by any number of methods. For example, the precipitated organic nanocrystal may be deposited directly onto a suitable receiving medium upon depressurization, or the organic nanocrystals may be first collected in a suitable liquid to form a dispersion, which dispersion may be coated on the receiving medium. Due to the surfactant coating of the organic nanocrystals during the depressurization process, the organic nanocrystals will be stable and not undergo significant agglomeration. When the precipitated organic nanocrystals are first collected in a suitable solvent in which they are insoluble, the result is a stable dispersion. The application of the dispersion to a solid surface and subsequent removal of the solvent through evaporation results in the arrangement of the organic nanocrystals into a superlattice structure. The characteristics of the superlattice structure resemble that which is obtained when the organic nanocrystals are directly deposited onto a substrate. Thus, discrete organic nanocrystals can be obtained as a stable dispersion in a liquid or as a stable superlattice film on any substrate, depending on the processing conditions.

It has also demonstrated through examples that the characteristic d-spacing of the self-assembled superlattice of the organic nanocrystals is independent of the nature of the substrate, subject to the ionic content limitations described above. This has been demonstrated for different types of chemical compounds (such as organic light emitting dopant materials and metallo-organic pigments) deposited on different substrates (such as amorphous glass, single crystal quartz, and semicrystalline poly(ethylene terephthalate)). We have also demonstrated that the characteristic d-spacing of the self-assembled superlattice is dependent only on the size of the organic nanocrystals and not on the chemical and molecular nature and identity of the functional materials and or surfactant.

EXAMPLES

The following is a description of the high pressure system used in these Examples. A system flow diagram is shown below in FIG. 1. The functioning of the system may be described as follows: A source of carbon dioxide is attached to the system (fluid source 11). $CO_2$ is plumbed from the source through heat exchanger (12) to a high pressure piston pump (13) and to a syringe pump (14). Heat exchanger 12 reduces the temperature of the $CO_2$, liquefying it. A cooling bath (not shown) continuously flushes the necessary coolant through the heat exchanger and also through jacketed pumps 13 and 14 so as to maintain the temperature within the system constant. Pumps 13 and 14 connect to a variable volume vessel (15), which is a high pressure stainless steel vessel provided with a stirrer (16), piston (17), and ports for windows (18, 19) and for sensors (20, 21) as well as electrical heating using cartridge heaters (22, 23).

A known volume of $CO_2$ is loaded into the syringe pump 14. The density of $CO_2$ in the syringe pump is calculated using an equation of state, the volume and the temperature. The variable volume vessel 15 is opened from either the stirrer 16 side or from the piston 17 side (which requires additionally the removal of the piston). A pre-weighed amount of the appropriate functional material and surfactant is placed within the formulation side of vessel 15. The vessel 15 is then re-sealed.

The known amount of $CO_2$ is injected into the formulation side of the variable volume vessel 15. Some $CO_2$ is also added to the piston side of vessel 15 using pump 13. The amount of carbon dioxide added to the piston side relative to that added within the formulation side determines the pressure within the formulation side of vessel 15. Conditions are adjusted until the formulation is at desired pressure and temperature conditions (supercritical or liquid or dense gas phase). Since the amounts of functional material, surfactant and $CO_2$ are known, the concentration of the formulation within the vessel 15 is known. Alternatively, it is possible to use injection valve 24 to introduce a liquid functional material and/or surfactant into the formulation side after pressurization with a known amount of $CO_2$. Additional valves 25a, 25b, 25c, 25d are used to control pressures and material deliveries to vessel 15.

The stirrer 16 is turned on (if desired) for adequate mixing of the material with the dense phase fluid $CO_2$. The pressure and temperature in the formulation side are monitored using pressure sensor 20 and temperature sensor 21 respectively. Conditions within the vessel 15 are monitored through visual observation through the quartz windows 18, 19 provided.

Valve 26 controls the release of formulation out of the formulation side of vessel 15. Any subsequent control over the released formulation may be done through the controlled opening of valve 26 and additional valves, nozzles, aerodynamic lenses, electrostatic rings, high frequency actuators, etc., in the exhaust line.

Deposits of precipitated materials on substrates prepared in the below examples were subjected to low-angle X-ray diffraction (XRD) analysis to obtain a diffraction pattern. XRD measurements were performed using a Rigaku Ultrax diffraction system, copper radiation, diffracted beam graphite monochromator tuned to CuKα radiation, and scintillation detector. Separately, the same functional materials were analyzed in the form of as-received powders. These powders are used to obtain reference diffraction patterns for that functional material.

Luminescence data were collected using a Spex Industries Front-Back End Double Spectrometer. The excitation wavelength was 360 nanometers and the emission capture range was 380–800 nanometers.

Photomicrographs were obtained using a Philips Model 505 scanning electron microscope, operated at a voltage of 30 kilovolts.

The following chemicals listed in Table 1 were utilized in the examples and comparative examples described below:

TABLE 1

| Chemical | Material | Supplier |
| --- | --- | --- |
| C1 | Fluorolink 7004 ® | Ausimont Montedison Group |
| C2 | Carbon dioxide, $CO_2$ | Airgas Products |
| C3 | 1H,5H,11H-(1)Benzopyrano(6,7,8-ij) quinolizin-11-one, 10-(2-benzothiazolyl)-2,3,6,7-tetrahydro-1,1,7,7-tetramethyl, C545T | Eastman Kodak Company |
| C4 | Copper Phthalocyanine, CuPc | Eastman Kodak Company |
| C5 | Isopropyl alcohol | Eastman Kodak Company |

Chemical C1 is a surfactant of the formula $Cl(CF_2CF(CF_3)O)_nCF_2COO^-NH_4^+)$. C2 is used as a super critical fluid solvent. Chemicals C3 and C4 are organic materials used to make the self-assembled organic nanocrystal thin films. C3 is an organic light emitting diode dopant material, while C4 is a metallo-organic pigment. C5 is a liquid used to disperse nanocrystals. The molecular structures for C3 and C4 are shown below.

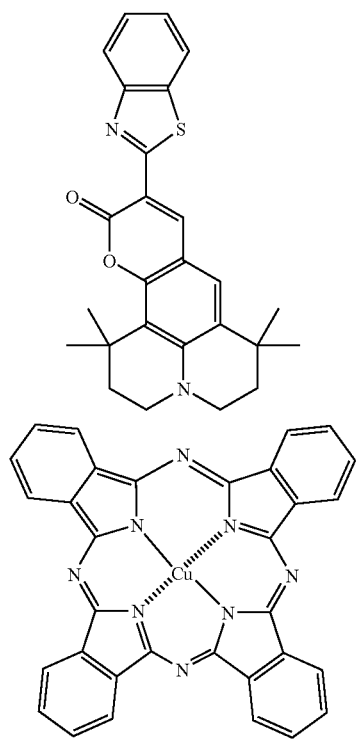

C3

C4

Comparative Example 1

Figure 2:
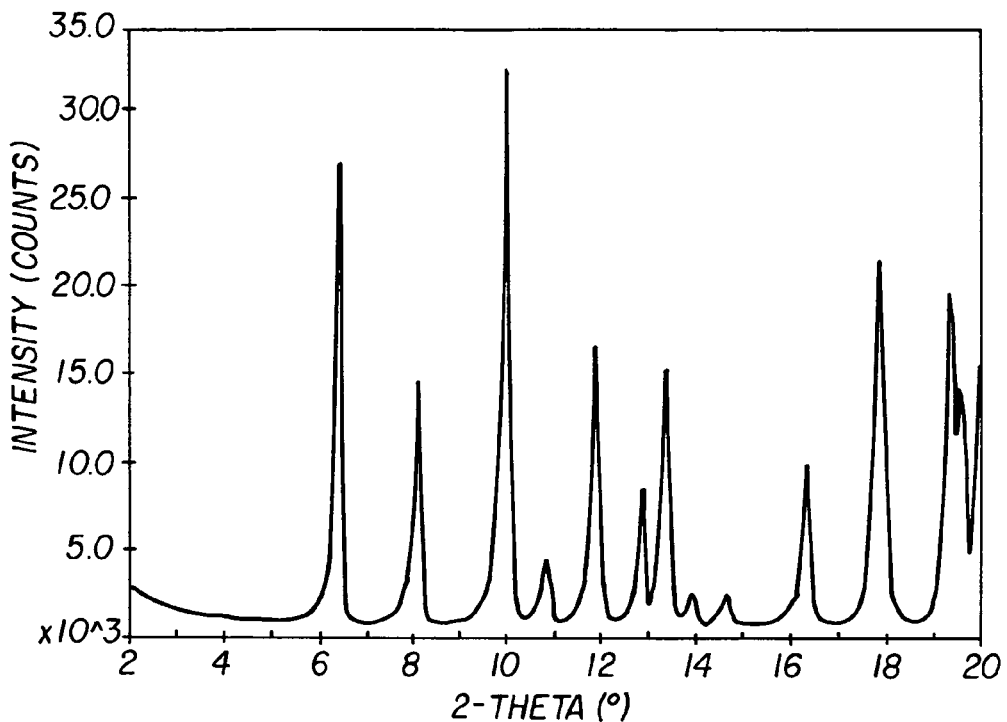
FIG. 2: X-ray diffraction pattern for as received C3 starting material.

C3 powder was analyzed by XRD. The diffraction pattern is shown in FIG. 2. This material is characterized by the first three diffraction peaks with interplanar d-spacings of 1.37, 1.08, and 0.88 nm.

Comparative Example 2

Figure 3:
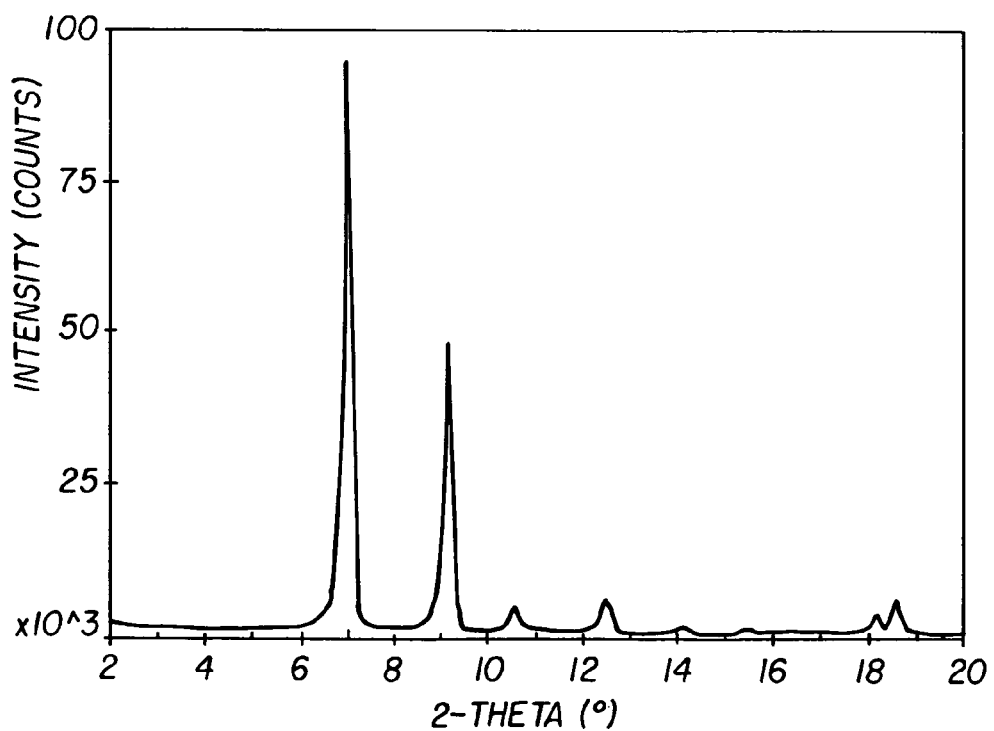
FIG. 3: X-ray diffraction pattern for as received C4 starting material.

C4 powder was analyzed by XRD. The diffraction pattern is shown in FIG. 3. This material is characterized by the first two diffraction peaks with interplanar d-spacings of 1.27 and 0.97 nm.

Example 1

0.0058 g of C3, 0.555 g of C1, and 5.0 g of C2 were placed in a high pressure cell at 25.3° C. and 150 atm and mixed. When the system was visibly homogeneous, the formulation was expanded to ambient condition through a needle valve for 5 seconds to deposit C3 on a glass slide. The precipitated material was collected and analyzed for photoluminescence (FIG. 4).

Figure 4:
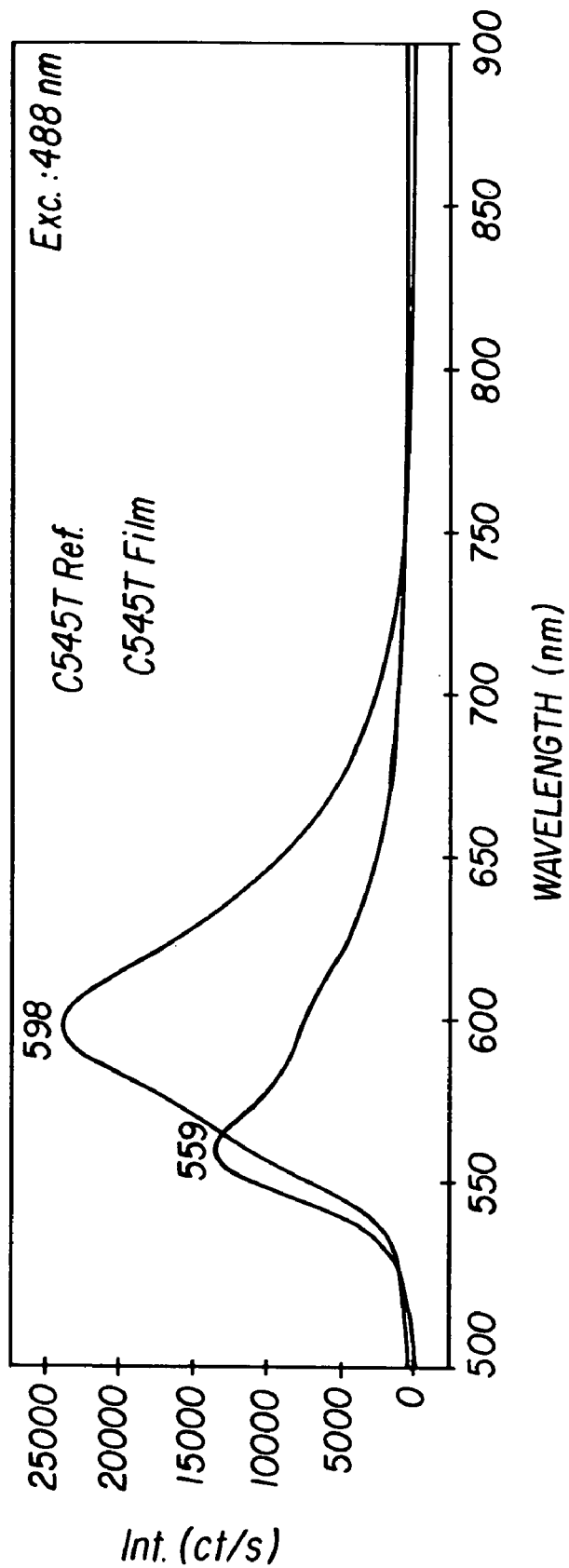
FIG. 4: Photoluminescence spectra for the liquid dispersion of C3 prepared according to Example 1 and for as received C3 starting material when excited at 514 nm.

Table 2 shows the results obtained from the photoluminescence data in FIG. 4.

TABLE 2

| Materials | Excitation frequency (nm) | Emission frequency (nm) at maximum intensity |
| --- | --- | --- |
| C3 Reference | 488 | 598 |
| C3 deposit from sc-CO2 | 488 | 559 |

The emission frequency for C3 deposited from super critical C2 shows a significant shift of 39 nm when compared to the emission from a reference sample of C3 powder, verifying that the C3 organic nanocrystals deposited from super critical C2 exist in a distinct form.

Figure 5:
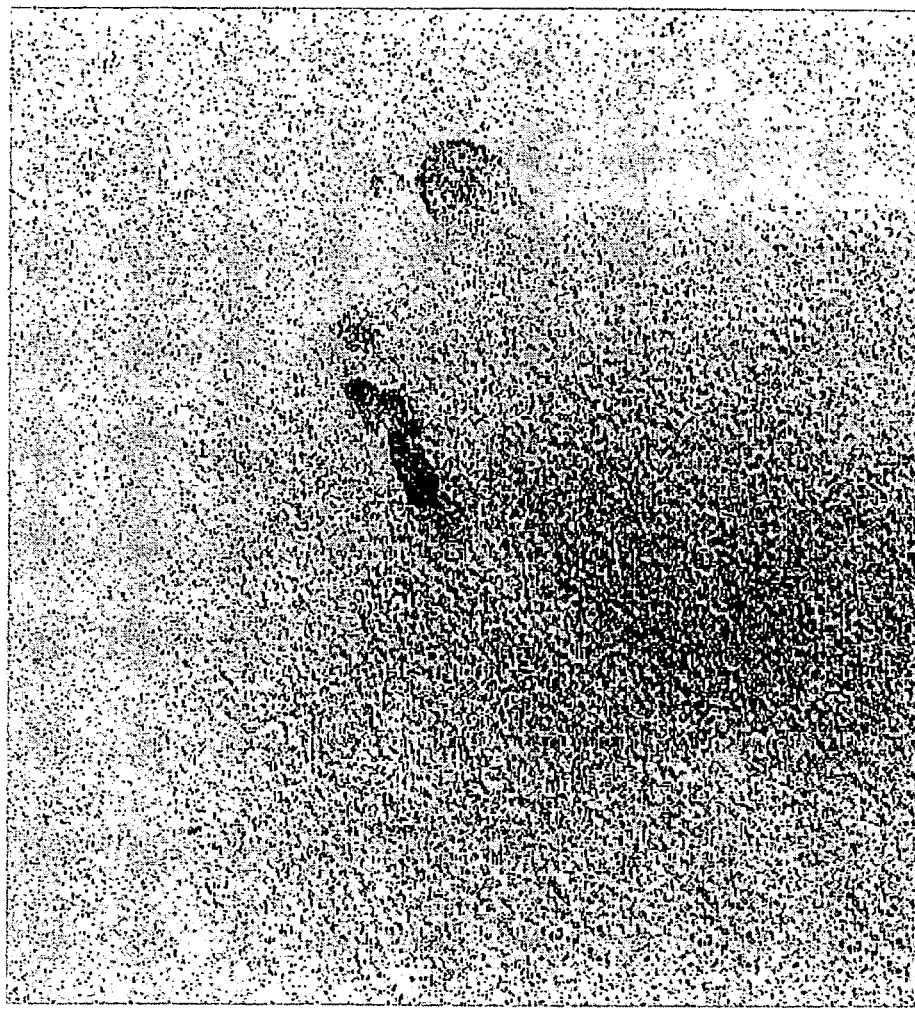
FIG. 5: Transmission electron micrograph of C3 prepared according to Example 1.

Transmission electron microscopy data for Example 1 are shown in FIG. 5. The data in FIG. 5 show nanoparticles on the order of 2–5 nm in diameter.

Figure 6:
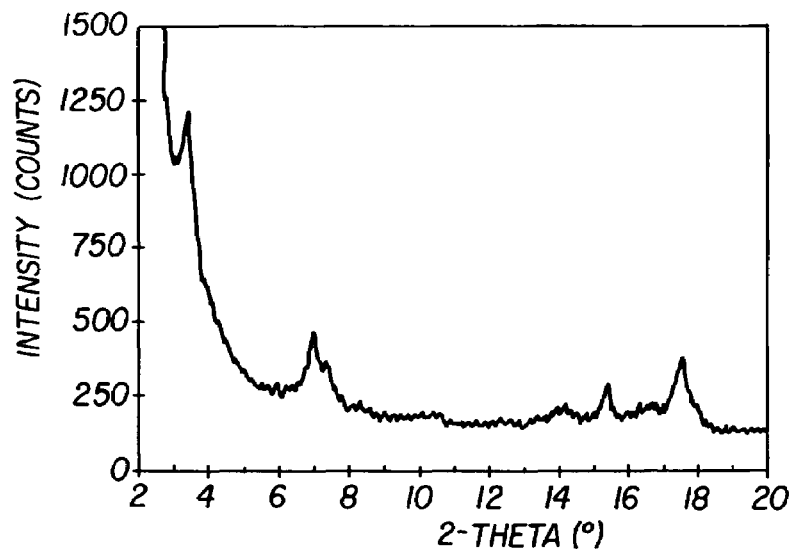
FIG. 6: X-ray diffraction pattern of C3 prepared according to Example 1.

X-ray diffraction data for C3 material deposited on the glass slide in Example 1 are shown in FIG. 6. The presence of a low angle diffraction peak at an interplanar d-spacing of 2.59 nm indicates that a superlattice has been generated. Comparative Example 1 for as-received C3 powder does not show evidence of a diffraction peak with a 2.59 nm spacing.

The data shown in FIGS. 4, 5, and 6 and in Table 2, demonstrate that materials generated using the method described in this invention are organic nanocrystals and exhibit the property of self-assembly.

Example 2

Figure 7:
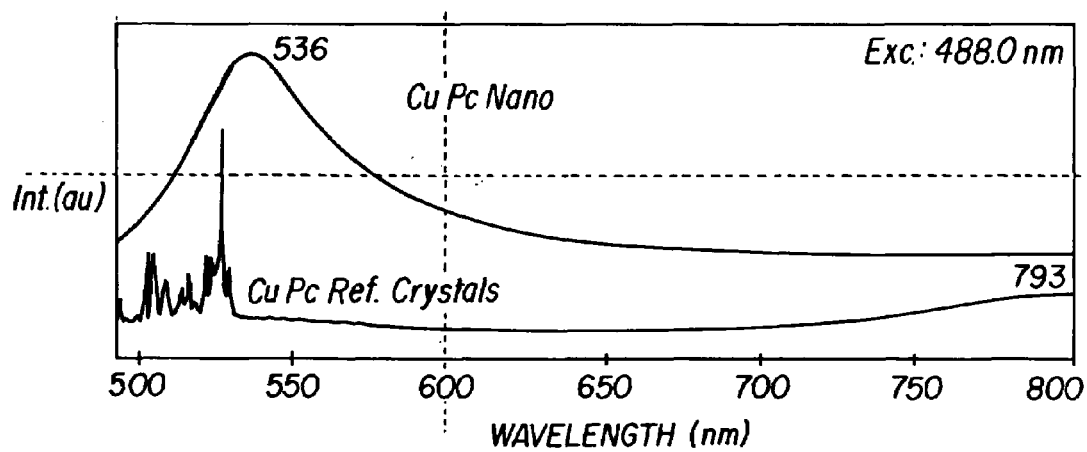
FIG. 7: Photoluminescence spectra for the liquid dispersion of C4 prepared according to Example 2 and for as received C4 starting material when excited at 514 nm.

0.0126 g of C4 powder, 0.4763 g of C1, and 7.06 g of C2 were placed in a high pressure cell at 25.3° C. and 150 atm. and mixed. When the system was visibly homogeneous, the formulation was expanded to ambient condition through a needle valve for 5 seconds. The precipitated material was collected onto a glass slide and analyzed for photoluminescence (FIG. 7). Table 3 shows the results obtained from the photoluminescence data in FIG. 7.

TABLE 3

| Materials | Excitation frequency (nm) | Emission frequency (nm) at maximum intensity |
|---|---|---|
| C4 Reference | 488 | 793 |
| C4 deposited from sc-C2 | 488 | 536 |

The emission frequency for C4 deposited from super critical C2 shows a significant shift when compared to the emission from a reference sample C4, verifying that the C4 deposited from super critical C2 exist in the form of organic nanocrystals.

Figure 8:
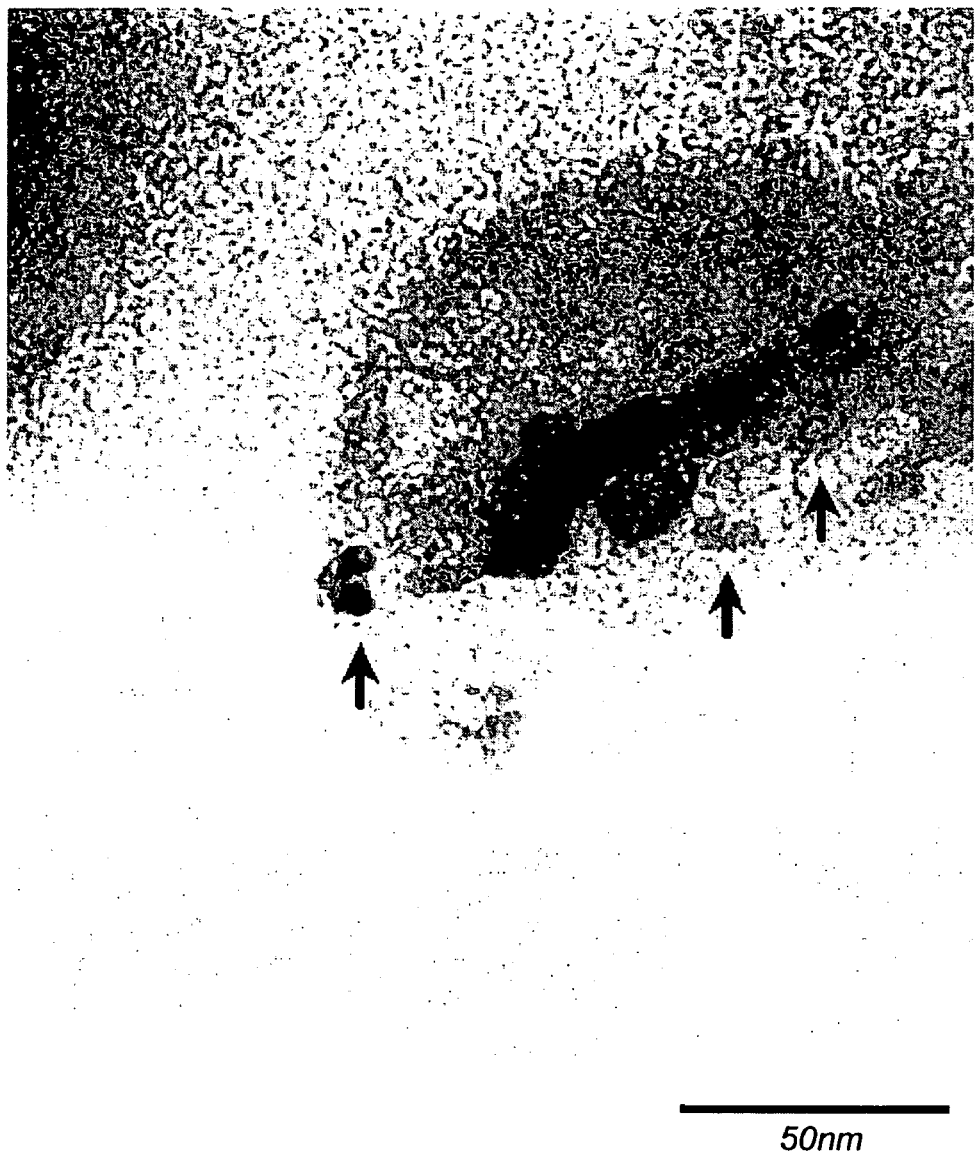
FIG. 8: Transmission electron micrograph of C4 prepared according to Example 2.

Transmission electron microscopy data for Example 2 are shown in FIG. 8. The data in FIG. 8 show nanoparticles on the order of 2–5 nm in diameter.

Figure 9:
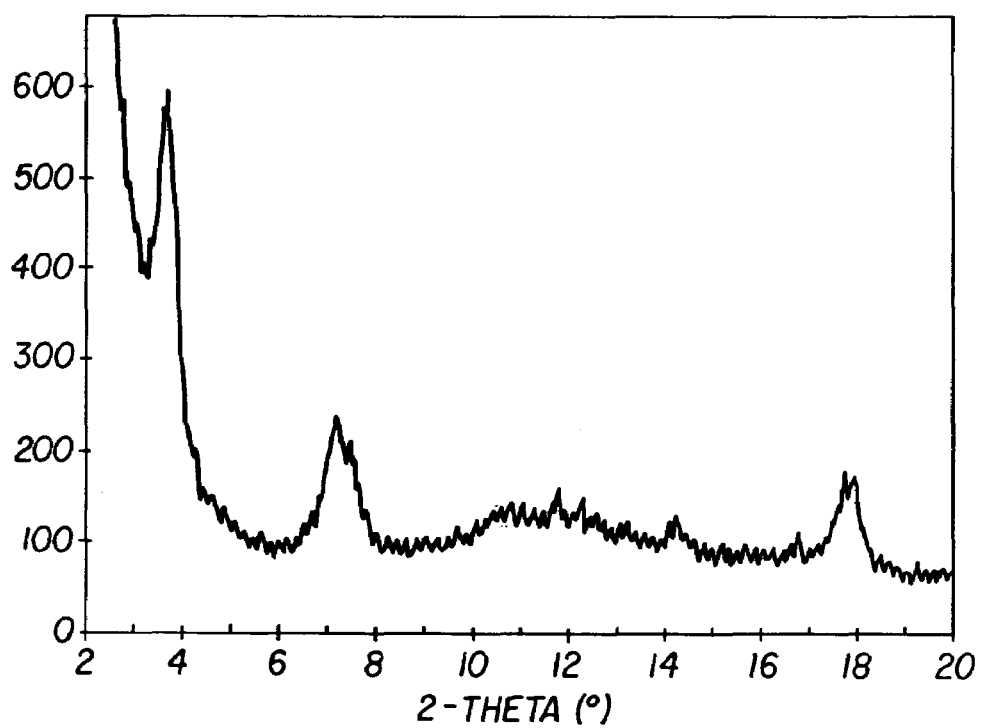
FIG. 9: X-ray diffraction pattern of C4 prepared according to Example 2.

X-ray diffraction data for C4 material deposited on the glass slide in Example 2 are shown in FIG. 9. The presence of a low angle diffraction peak at an interplanar d-spacing of 2.45 nm indicates that a superlattice has been generated. Comparative Example 2 for as-received C4 powder does not show evidence of a diffraction peak with a 2.45 nm spacing.

The data shown in FIGS. 7, 8, and 9 and in Table 3, demonstrate that materials generated using the method described in this invention, are nanoparticles and exhibit the property of self-assembly.

Example 3

Figure 10:
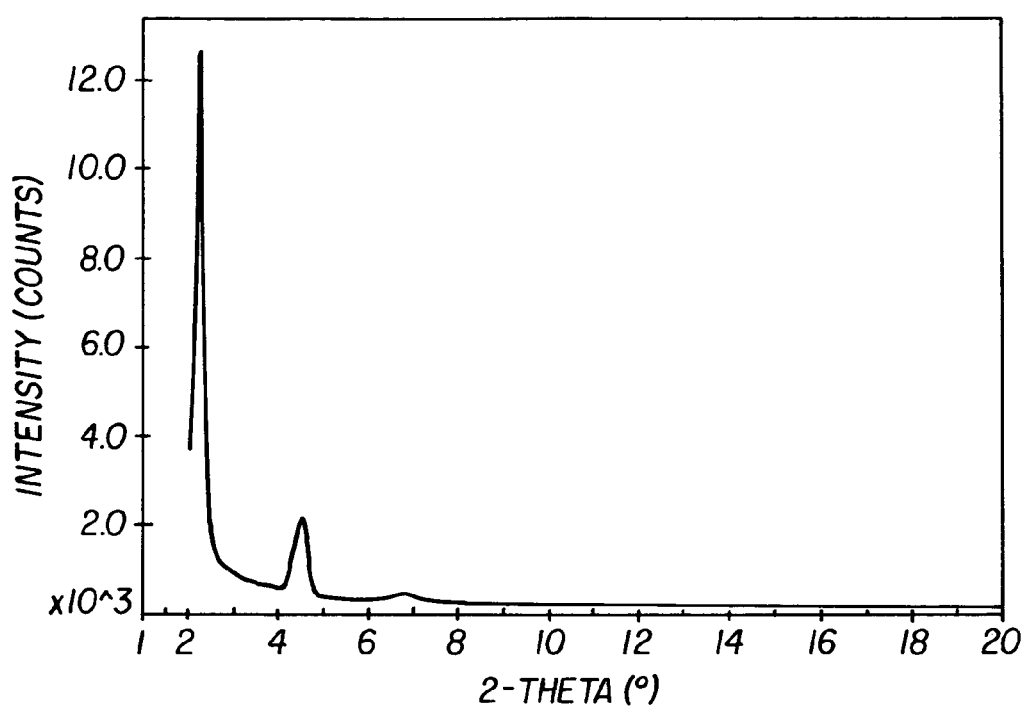
FIG. 10: X-ray diffraction pattern of C4 prepared according to Example 3.

The variable volume vessel used in the system used to generate the sample in Example 2 was subsequently opened and rapidly depressurized, and a deposit of nanoparticulates on the mixing blades was observed. The blades were rinsed with 20 ml of C5. The resulting nanodispersion was collected into a glass vial. A 0.5 ml aliquot of this dispersion was dried in ambient air on a quartz slide and was analyzed by X-ray diffraction. The XRD data demonstrate the presence of a strong periodic arrangement of the nano-sized materials with a d-spacing of 4.0 nm (FIG. 10). The observation of three orders of periodicity in the low-angle region of the X-ray diffraction pattern is evidence of a self-assembled organic nanocrystal superlattice. Comparative Example 2 for as-received C4 powder does not show evidence of a diffraction peak with a 4.0 nm spacing.

The data shown in FIG. 10 demonstrate that materials generated using the method described in this invention, are organic nanocrystals and exhibit the property of superlattice film self-assembly.

Comparative Example 3

Figure 11:
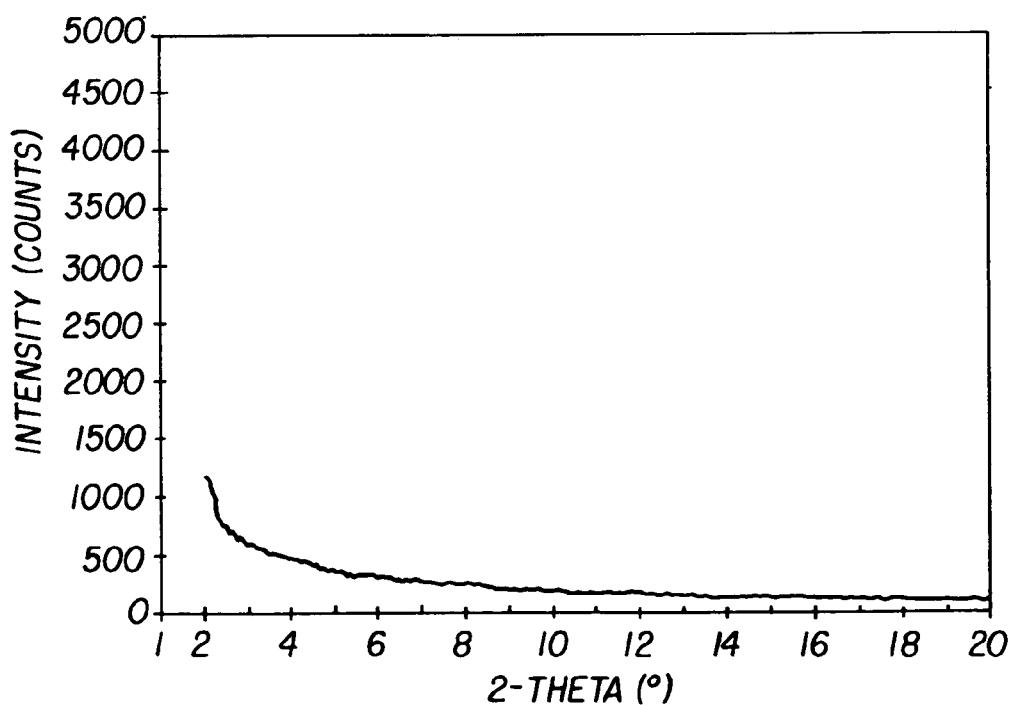
FIG. 11: X-ray diffraction pattern of C4 prepared according to Comparative Example 3.

A 0.5 ml aliquot of a 0.1 molar NaCl aqueous solution was deposited onto a quartz slide and allowed to dry in ambient air. A 0.5 ml aliquot of the nanodispersion prepared in Example 3 was deposited and dried in ambient air on the NaCl layer on top of the quartz slide and was analyzed by X-ray diffraction. The XRD data demonstrate the absence of any periodic arrangement of the nano-sized materials. The observation that there is no periodic diffraction peaks in the low-angle region of the X-ray diffraction pattern (FIG. 11) is evidence that there is no self-assembled organic nanocrystal superlattice.

Deposition of the organic nanocrystal dispersion in Example 3 did show evidence of self-assembly. When this same dispersion was deposited onto an ionic material (NaCl) contaminated substrate in Comparative Example 3, self-assembly did not occur. Comparative Example 3 demonstrates that substrates containing ionic materials that will dissolve in the nanodispersion upon deposition on the substrate, causing the thin film of nanodispersion on the substrate to have an ionic strength greater than 0.001 M, will prevent materials generated using the method described in this invention from exhibiting the property of self-assembly.

The invention has been described in detail with particular reference to certain preferred embodiments thereof, but it will be understood that variations and modifications can be effected within the spirit and scope of the invention.

What is claimed is:

1. A process for the preparation of a self assembled superlattice thin film of organic nanocrystal particles comprising:
    (i) combining one or more functional organic material to be precipitated as nanocrystal particles and one or more surface active material in a compressed $CO_2$ phase with a density of at least 0.1 g/cc, where the functional material is substantially insoluble in the compressed $CO_2$ in the absence of the surfactant, the surfactant comprises a compressed $CO_2$-philic portion and a functional material-philic portion, and the compressed $CO_2$ phase, functional material and surfactant interact to form an aggregated system having a continuous compressed $CO_2$ phase and a plurality of aggregates comprising surfactant and functional material molecules of average diameter less than 50 nanometers dispersed therein;
    (ii) rapidly depressurizing the compressed $CO_2$ phase thereby precipitating the dispersed functional and surfactant materials in the form of composite organic nanocrystals of average diameter less than 50 nanometers; and
    (iii) depositing the organic nanocrystals on a substrate surface, wherein the organic nanocrystals form a thin film having an ionic content of less than 0.001 M in equivalent sodium chloride concentration on the substrate surface, and the thin film exhibits a long range periodicity in the arrangement of the organic nanocrystals in a self assembled superlattice structure, as evidenced by x-ray diffraction.

2. A process according to claim 1, where the molar ratio of the surfactant to the functional material is at least 1:1.

3. A process according to claim 1, where the molar ratio of the surfactant to the functional material is at least 10:1.

4. A process according to claim 1, wherein the compressed carbon dioxide is a supercritical fluid.

5. A process according to claim 1, wherein the functional and surfactant materials are precipitated in the form of composite particles of average diameter from 0.5 to 10 nanometers.

6. A process according to claim 1, wherein the functional organic material comprises a pure organic compound.

7. A process according to claim 1, wherein the functional organic material comprises a metallo-organic compound.

8. A process according to claim 1, wherein the functional material-philic portion of the surfactant comprises a $CO_2$-phobic portion.

9. A process according to claim 8, wherein the surfactant is a fluorinated, perfluoropolyether, or siloxane surfactant having a $CO_2$-philic portion and a $CO_2$-phobic portion.

10. A process according to claim 1, wherein the ratio of compressed carbon dioxide to functional material is from about 100,000:1 to about 1:1.

11. A process according to claim 1, wherein the thin film formed in step (iii) has a thickness of less than 10 micrometers.

12. A process according to claim 1, wherein the thin film formed in step (iii) has a thickness of less than 1 micrometer.

13. A process according to claim 1, wherein the thin film formed in step (iii) has a thickness of less than 0.1 micrometers.

14. A process according to claim 1, wherein d-spacing of the self-assembled structure ranges from 0.5 nm to 100 nm.

15. A process according to claim 1, wherein d-spacing of the self-assembled structure ranges from 0.5 nm to 10 nm.

16. A thin film obtained from the process of claim 1 comprising a self assembled superlattice of functional organic material nanocrystal particles.

17. A thin film according to claim 16, wherein the functional organic material comprises a pure organic compound.

18. A thin film according to claim 16, wherein the functional organic material comprises a metallo-organic compound.

19. A thin film according to claim 16, having a thickness of less than 10 micrometers, and wherein d-spacing of the self-assembled structure ranges from 0.5 nm to 100 nm.

20. A thin film according to claim 16, having a thickness of less than 1 micrometer, and wherein d-spacing of the self-assembled structure ranges from 0.5 nm to 10 nm.

* * * * *